(12) United States Patent
Boyksen

(10) Patent No.: US 11,007,767 B2
(45) Date of Patent: May 18, 2021

(54) LIGHT EXPOSURE DEVICE AND METHOD FOR EXPOSING PLATE-SHAPED MATERIALS TO LIGHT

(71) Applicant: Flint Group Germany GmbH, Stuttgart (DE)

(72) Inventor: Frank Boyksen, Altdorf (DE)

(73) Assignee: Flint Group Germany GmbH, Stuttgart (DE)

( * ) Notice: Subject to any disclaimer, the term of this patent is extended or adjusted under 35 U.S.C. 154(b) by 70 days.

(21) Appl. No.: 16/463,024

(22) PCT Filed: Nov. 27, 2017

(86) PCT No.: PCT/EP2017/080523
§ 371 (c)(1),
(2) Date: May 22, 2019

(87) PCT Pub. No.: WO2018/096144
PCT Pub. Date: May 31, 2018

(65) Prior Publication Data
US 2020/0023632 A1    Jan. 23, 2020

(30) Foreign Application Priority Data

Nov. 28, 2016  (EP) ..................... 16200954

(51) Int. Cl.
*B41C 1/05*       (2006.01)
*G03F 7/20*       (2006.01)
*B41N 1/12*       (2006.01)

(52) U.S. Cl.
CPC .................. *B41C 1/05* (2013.01); *B41N 1/12* (2013.01); *G03F 7/2004* (2013.01)

(58) Field of Classification Search
None
See application file for complete search history.

(56) References Cited

U.S. PATENT DOCUMENTS

| 5,262,275 | A  | 11/1993 | Fan |
| 6,211,942 | B1 | 4/2001  | Okamoto |

(Continued)

FOREIGN PATENT DOCUMENTS

| EP | 1069475 A1 | 1/2001 |
| EP | 3054349 A1 | 8/2016 |

(Continued)

OTHER PUBLICATIONS

International Search Report for PCT/EP2017/080523 dated Feb. 9, 2018.

(Continued)

*Primary Examiner* — Joshua D Zimmerman
(74) *Attorney, Agent, or Firm* — Faegre Drinker Biddle & Reath LLP

(57) ABSTRACT

The invention relates to an exposure apparatus (1) for exposing plate-shaped materials (2). The plate-shaped material (2) has a first side (3) and a second side (4) that lies opposite the first side (3). The exposure apparatus (1) comprises a first exposure unit (10) and a conveyor unit (30), wherein the first exposure unit (10) comprises at least one segment with a light source and has an embodiment so as to be rotatable about an axis (14), and the first exposure unit (10) and the conveyor unit (30) are configured in such a way that the first side (3) of the plate-shaped material (2) is supplied for an exposure in a first position (11) of the exposure unit (10) and the second side (4) of the plate-shaped material (2) is supplied for an exposure in a second position (12) of the exposure unit (10).
Further aspects of the invention relate to methods for exposing plate-shaped material and a printing plate that was produced from a plate-shaped material according to any one of the methods.

18 Claims, 4 Drawing Sheets

(56) References Cited

U.S. PATENT DOCUMENTS

| | | |
|---|---|---|
| 8,288,080 B2 | 10/2012 | Becker et al. |
| 8,578,854 B2 | 11/2013 | Sievers |
| 8,685,624 B2 | 4/2014 | Döttinger et al. |
| 8,762,740 B2 | 6/2014 | Kanai |
| 9,937,703 B2 | 4/2018 | Stebani et al. |
| 10,112,381 B2 | 10/2018 | Schadebrodt et al. |
| 10,175,580 B2 | 1/2019 | Fronczkiewicz et al. |
| 2011/0104615 A1 | 5/2011 | Sievers |
| 2016/0088868 A1 | 3/2016 | Dobrinsky et al. |

FOREIGN PATENT DOCUMENTS

| | | |
|---|---|---|
| WO | WO-2008095994 A1 | 8/2008 |
| WO | WO-2009141256 A1 | 11/2009 |
| WO | WO-2012010459 A1 | 1/2012 |
| WO | WO-2012145111 A1 | 10/2012 |
| WO | WO-2014035566 A1 | 3/2014 |
| WO | WO-2015044437 A1 | 4/2015 |
| WO | WO-2015060972 A1 | 4/2015 |
| WO | WO-2016096945 A1 | 6/2016 |

OTHER PUBLICATIONS

Written Opinion of the International Searching Authority for PCT/EP2017/080523 dated Feb. 9, 2018.

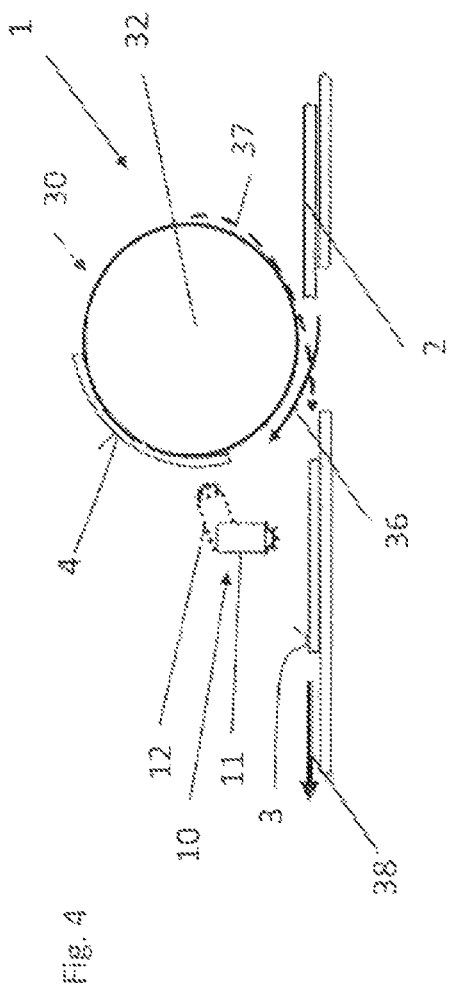

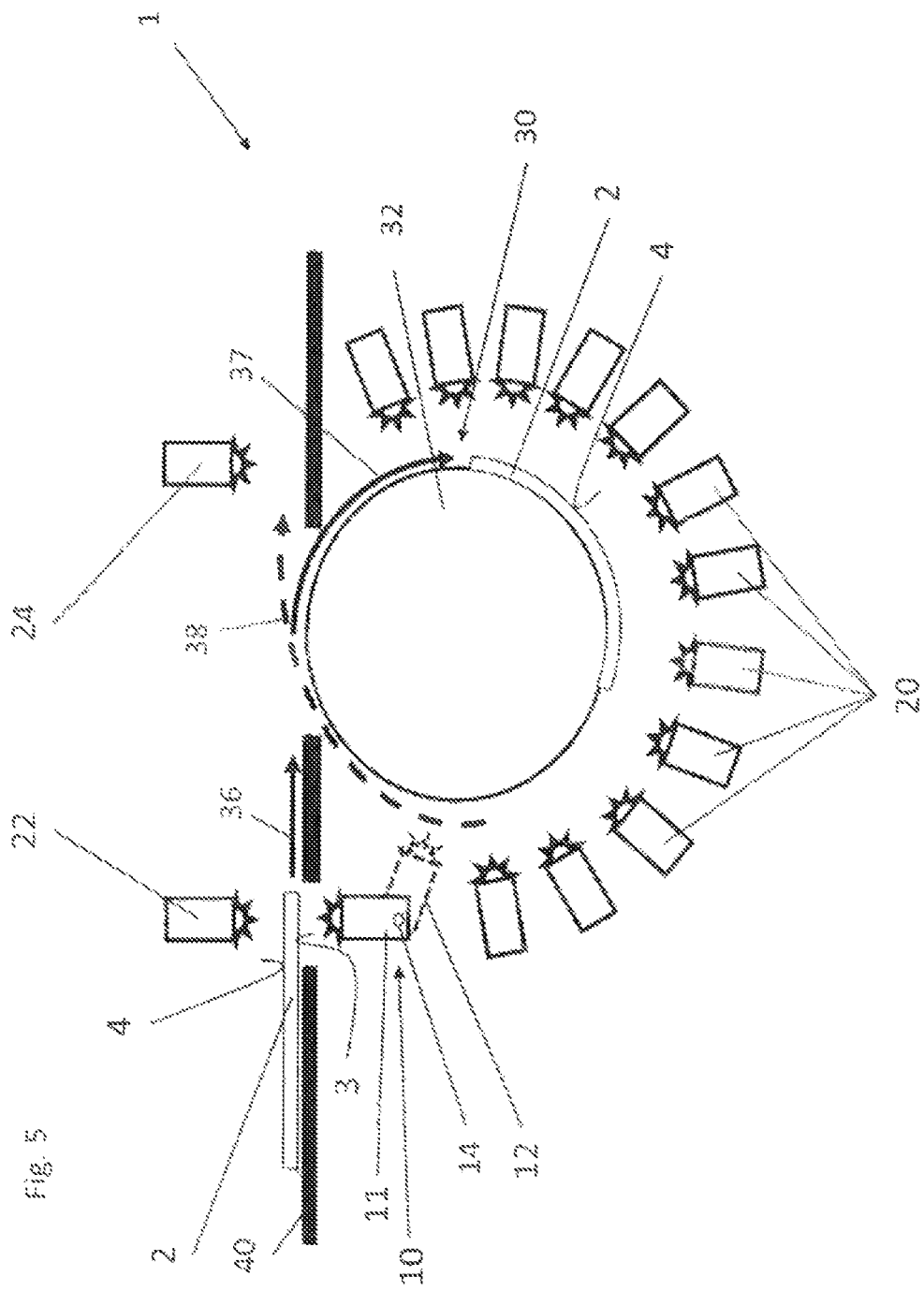

LIGHT EXPOSURE DEVICE AND METHOD FOR EXPOSING PLATE-SHAPED MATERIALS TO LIGHT

CROSS-REFERENCE TO RELATED APPLICATIONS

This application is a national stage application (under 35 U.S.C. § 371) of PCT/EP2017/080523, filed Nov. 27, 2017, which claims benefit of European Application No. 16200954.2, filed Nov. 28, 2016, both of which are incorporated herein by reference in their entirety.

The invention relates to an exposure apparatus for exposing plate-shaped materials, methods for exposing plate-shaped materials and a printing plate that was produced from a plate-shaped material according to any one of the methods.

The plate-shaped material relates to, in particular, printing elements that are suitable for producing printing plates. In principle, such printing elements are known in the prior art. They comprise at least one dimensionally stable carrier and a relief-forming layer. Additionally, the printing plates may have an imageable layer, which may relate to, for example, a laser-ablatable layer, a layer that is writable by means of inkjet printers or a thermographic layer, with laser-ablatable layers, also referred to as LAMS (laser-ablatable mask layers), being the most common. The use of photopolymerizable layers is conventional for the relief-forming layer. Furthermore, use is usually made of blocking or barrier layers in order to keep away unwanted substances, such as water and/or oxygen.

Proceeding from such printing elements, the production of printing plates is implemented by means of a multistage process using appropriate apparatuses for each method step.

If use is made of a printing element having a laser-ablatable layer, a mask is initially written into the imageable layer using an IR laser. Here, this may relate to laser installations with a rotating drum, flatbed installations or internal-drum lasers.

After writing the mask, the printing element is exposed to UV radiation or UV/VIS radiation through the formed mask. The photopolymerizable layer polymerizes in the regions no longer covered by the mask, while there is no polymerization in the covered regions. UV exposers are used to this end, which may comprise various UV sources, for example UV tubes or UV LEDs.

Following exposure, the remains of the mask and the non-polymerized components of the photopolymerizable layer are removed. This can be implemented using one or more solvents, or else thermally. Special washers, e.g., brush washers, are used for washing out by means of solvent and/or water or aqueous solutions. For thermal developing, use can be made of developers in which a developer medium (e.g., an absorbent nonwoven) is brought into contact with the liquefied non-exposed layer, and removed. If solvents are used to develop the plate, this is followed by a drying step in a dryer.

The prior art has disclosed apparatuses and methods for carrying out the exposure. WO 2016/096945 A1 has disclosed a method and a corresponding apparatus, in which multiple exposure with LEDs (light-emitting diodes) are carried out in several exposure cycles using different exposure intensities for the purposes of producing flexographic printing plates. The individual exposure cycles are realized by virtue of UV LEDs being moved parallel to the surface of a flexographic printing plate. The UV LEDs are arranged on one or more LED strips, which are moved parallel to the surface of the flexographic printing element. Here, the LEDs may be fixedly installed and the flexographic printing element can be moved or, vice versa, the flexographic printing element can be at rest during the exposure and the LEDs can be moved. Furthermore, at least one of the LED strips can be arranged in stationary fashion and further LED strips can be arranged in movable fashion.

WO2012/010459 A1 has disclosed an apparatus for in-line production of flexographic printing plates by means of digital imaging. The apparatus comprises a first exposure unit comprising a multiplicity of LEDs arranged in an array, which is able to emit UV light with an intensity of 100 mW/cm$^2$, and a second exposure unit comprising a UV radiation source that differs from LEDs, preferably a UV tube or UV emitter. The exposure is implemented with an intensity of 100 mW/cm$^2$ in a first exposure step and with an intensity of <100 mW/cm$^2$ in a second exposure step.

US 2011/0104615 A1 has disclosed apparatuses and methods for exposing a printing plate. Printing plates are arranged on a rotating drum and exposed by a UV source, for example an LED array, during a rotation of the drum in one embodiment variant. The UV source is displaced in a direction parallel to the axis of the drum in one variant. In a further embodiment, the length of the UV light source corresponds to the length of the drum and no movement of the UV light source is provided; only the drum rotates.

U.S. Pat. No. 8,762,740 B2 has disclosed an exposure apparatus which comprises a drum, a UV light source and an imaging unit. Moreover, a method is described in which a mask is written by way of a laser of the imaging unit and an exposure that leads to the formation of surface structures with flat surfaces (flat top dots, FTD) is carried out by way of the UV light source. Subsequently, a further mask is written and an exposure is carried out, the latter leading to the formation of surface structures with rounded surfaces (round top dots). The method requires much outlay as a result of the multiple writing of masks.

U.S. Pat. No. 8,578,854 B2 has disclosed a method for UV LED exposure of flexographic printing plates, in which a UV LED exposure unit is situated in a reflector tunnel. The UV radiation is initially scattered in the reflector tunnel, as a result of which halftone dots with broad support shoulders can be realized.

Document WO 2014/035566 A1 describes a flexographic printing plate, which is exposed by means of UV LEDs, wherein the exposure is implemented using two UV LED arrangements. The two UV LED arrangements preferably have different wavelengths.

U.S. Pat. No. 6,211,942 B1 has disclosed a system for exposing substrates on two sides. The apparatus comprises a single UV light source, when the light of the lamp is directed at a rotatable mirror. The light of the lamp can be guided in two different directions by rotating the mirror, with UV light being guided through a first mask onto a first side of the substrate with the mirror in a first position and UV light being guided through a second mask onto the second side of the substrate with the mirror in a second position. A movement or rotation of the UV light source itself is not envisaged.

When producing printing plates from a plate-shaped material, it is necessary, as a rule, to expose both the front side and the back side thereof. In known exposure apparatuses, it is necessary to turn the plate-shaped material to this end, requiring time and space. Moreover, there is a risk of damaging the plate-shaped material when turning. Moreover, manual turning of the plate-shaped material is labor intensive.

Therefore, an object of the invention can be considered that of providing an apparatus and a method, with which both sides of a plate-shaped material can be exposed without manual turning.

Exposure apparatuses that provide an exposure unit for each of the two sides of the plate-shaped material are complicated. If LEDs are provided as a light source for the exposure of both sides, this additionally results in high costs since high-power UV LEDs are very expensive.

Therefore, a further object of the invention can be considered that of providing an improved exposure apparatus, in which the number of required exposure units is reduced.

DISCLOSURE OF THE INVENTION

An exposure apparatus for exposing plate-shaped materials is proposed. The plate-shaped material has a first side and a second side that lies opposite the first side. The exposure apparatus comprises a first exposure unit and a conveyor unit, wherein the first exposure unit has an embodiment so as to be rotatable about an axis and the first exposure unit and the conveyor unit are configured in such a way that the first side of the plate-shaped material is supplied for an exposure in a first position of the exposure unit and the second side of the plate-shaped material is supplied for an exposure in a second position of the first exposure unit.

The plate-shaped material relates to, preferably, printing elements and, particularly preferably, flexographic printing elements, which can be processed to form printing plates or flexographic printing plates. The phrase "first side" of the plate-shaped material may denote the front side or the back side of the plate-shaped material, with the term "second side" correspondingly denoting the other side of the plate-shaped material.

For the purposes of processing with the exposure apparatus according to the invention, photopolymerizable printing elements are preferably used as plate-shaped material. In particular, use can be made of any photopolymerizable flexographic printing element which comprises at least a dimensionally stable carrier, a relief-forming, photopolymerizable layer—that is preferably washable in organic washout media—and an imageable layer. Printing elements comprising a digitally imageable layer are preferred.

Plate-shaped, digitally imageable flexographic printing elements are known to the person skilled in the art per se and are commercially available. Examples of such flexographic printing elements are described in U.S. Pat. No. 5,262,275, EP-A 1 069 475, WO 2008/095994 A1, WO 2009/141256 A1 or WO 2012/010459 A1, for example.

The person skilled in the art makes a suitable selection, depending on the desired properties of the flexographic printing plate.

For the purposes of processing in the apparatus according to the invention, use can preferably be made of flexographic printing elements comprising a carrier film with a thickness of 50 to 300 μm. As a rule, this relates to a carrier film made of a material that is at least partly transparent to UV light in order to allow back side pre-exposure of the flexographic printing element. PET films, in particular, are suitable.

In a manner known per se, the photopolymerizable, relief-forming layer comprises at least one elastomeric binder, an ethylenically unsaturated monomer and a photoinitiator or a photoinitiator system. In addition to the aforementioned components, further components, for example a plasticizer, may still optionally be present. Preferably, this is a layer that is soluble in organic washout media or in water or aqueous solutions or a layer that is liquefiable by a temperature increase; however, flexographic printing elements with water-soluble, relief-forming layers may naturally also be processed in the apparatus according to invention. The elastomeric binders may be thermoplastic elastomeric block copolymers, for example, e.g., styrene butadiene or styrene isoprene block copolymers. As a rule, the relief-forming layer has a layer thickness of 300 μm to 7000 μm, preferably 1000 μm to 5000 μm. Naturally, employed flexographic printing elements may also comprise photopolymerizable, relief-forming layers of different compositions laid above one another.

By way of example, the digitally imageable layer can be a laser-ablatable layer, a layer that is writable by means of inkjet printers or else a thermographic layer. Preferably, this is a laser-ablatable layer.

The laser-ablatable mask layer, also referred to as LAMS layer, comprises at least one elastic binder, in particular a soft-elastic binder. Naturally, mixtures of a plurality of different binders may also be used. Examples of suitable binders comprise soft-elastic polyamides. As monomeric components, such polyamides z comprise long-chain, bifunctional fatty acids, which provide soft-elastic properties to the polyamide. Furthermore, polyester amides, cellulose derivatives, nitrocellulose, polyvinyl alcohols, polyvinyl acetate, ethylene vinyl acetate copolymers, polyacrylates or mixtures of the aforementioned polymers can be used, provided they have soft-elastic properties.

The laser-ablatable mask layer furthermore comprises UV- and/or IR-absorbing materials. Fine soot, in particular, is suitable as an absorbing material. Soot has very good absorbance both in the UV and IR range and, consequently, ensures fast imaging at the same time when imaging by means of an IR laser. Naturally, the laser-ablatable mask layer may also contain other UV and/or IR absorbers on pigment basis or soluble dyes. Soot is usually contained to an amount of 10 to 50 weight % in respect of the sum of all components. The layer thickness of the mask layer should be a few μm, preferably 1 μm to 4 μm.

The flexographic printing element usually has a capping film for protecting the mask layer.

Moreover, the flexographic printing element may optionally comprise even further layers, such as, for example, elastic substrates, adhesive layers or detackifying layers.

Furthermore, a UVA-light-transparent barrier layer for oxygen may optionally be arranged between the photopolymerizable layer and the laser-ablatable layer. Such a barrier layer limits or prevents the diffusion of oxygen into the photopolymerizable layer during the exposure and consequently contributes to a better printed image. In a manner known per se, the barrier layer may comprise a polymer binder with a low transmissivity for oxygen. Examples of suitable binders comprise polyamides, polyvinyl alcohol, hydroxyalkyl cellulose, polyvinylpyrrolidone, polyvinyl acetate ethylene-vinyl acetate copolymers, amphoteric interpolymers, cellulose acetate butyrate, alkyl cellulose, butyral, cyclic rubbers or combinations thereof. A barrier layer usually has a layer thickness of 0.3 μm to 5 μm. Further details in respect of barrier layers are disclosed in U.S. Pat. No. 5,262,275 or WO 2012/145111 A1, for example.

The first exposure unit comprises at least one light source. "Rotating the exposure unit" is understood to mean that the latter is rotated as a whole, i.e., including the at least one light source. Consequently, the at least one light source is likewise rotated or newly aligned when the exposure unit is rotated. The plate-shaped material is preferably exposed directly, with direct exposure being understood to mean that the light from the light source of the exposure unit is not steered via reflecting elements such as mirrors. In this case, too, direct exposure means that solid or liquid transparent or semitransparent materials may be situated between the light source and the plate-shaped material. Here, liquid materials are applied between solid layers and may additionally be used for the temperature control of the transparent material. Preferably, this relates to water, aqueous solutions, emulsions or dispersions or organic solvents. Solid materials are selected from the group of plastics, glasses, filters and combinations thereof. Polymers and inorganic glasses are preferably used as plastics and glasses, said polymers and inorganic glasses being transparent in the UV range and optionally filtering or blocking other wavelength ranges by the use of appropriate absorbers or additives. Preferably, use is made of quartz, silicates, polyenes (e.g., polyethylene, polypropylene, Teflon), polycarbonates, polyester, polyurethanes, polyamides or combinations thereof.

The conveyor unit is preferably configured to continuously or discontinuously convey plate-shaped materials through the exposure apparatus. When conveying is continuous, the exposure of the plate-shaped materials is implemented when the latter are moving relative to the respective exposure unit. When conveying is discontinuous, the exposure is preferably implemented at an instant when the plate-shaped materials are not conveyed and consequently are at rest in relation to the respective exposure unit.

Preferably, the conveyor unit comprises a rotatable drum, wherein the axis of rotation of the first exposure unit extends parallel to the rotation axis of the drum. As an alternative or in addition to a rotatable drum, the conveyor unit may comprise a continuous conveyor belt, wherein the axis of rotation of the first exposure unit is aligned preferably perpendicular to a conveying direction of the continuous conveyor belt and parallel to the plane of the continuous conveyor belt.

Preferably, the first exposure unit comprises the drum or the continuous conveyor belt in one of the positions of said exposure unit, for example in the second position, and so a plate-shaped material received on the drum or the continuous conveyor belt can be exposed by the first exposure unit. In the respective other position, the first exposure unit preferably does not have the drum or the continuous conveyor belt.

Preferably, the rotatable drum and/or the continuous conveyor belt has at least one fastening apparatus for plate-shaped materials, selected from a fastening strip, a clamping apparatus, a vacuum suction fastening mechanism, punched holes, punches or a combination of a plurality of fastening apparatuses.

For the purposes of conveying the plate-shaped material, the conveyor unit may comprise conveyor belts or transport rollers, for example, or the conveyor unit may comprise conveying means, by means of which the plate-shaped material can be pulled or pushed through the exposure apparatus by means of conveying chains, spindles or the like. The conveyor belts, transport rollers or further conveying means are preferably provided in addition to a rotatable drum and/or a continuous conveyor belt.

In a further preferred embodiment, no additional conveyor belts, transport rollers or further conveying means are provided in addition to a rotatable drum or a continuous conveyor belt.

The first exposure unit is configured and arranged in such a way that the latter is rotatable about an axis of rotation. Here, the term rotatable is also understood to mean a pivoting movement about an axis or a folding movement about an axis. As a result of a rotation about the axis of rotation, the first exposure unit can adopt a plurality of different positions. Here, provision is made for the first exposure unit to be able to be rotated at least into a first position by way of a rotation about the axis of rotation and able to be rotated into a second position by way of a rotation about this axis of rotation. Preferably, an appropriate actuator is provided for the purposes of carrying out the rotational movement.

The conveyor unit and the first exposure unit interact in such a way that the transport unit supplies the material to the first exposure unit in such a way that the first exposure unit is directed at the plate-shaped material. Here, the first exposure unit is preferably substantially at right angles to the plane of the plate-shaped material in both the first position and the second position. The first exposure unit points on the first side of the plate-shaped material if said first exposure unit is in the first position. The first exposure unit points on the second side of the plate-shaped material if said first exposure unit is in the second position. Here, substantially at right angles means that small deviations in the range of +/−30° from a 90° angle in relation to the plane of the plate-shaped material are possible.

In this way, an exposure of both the first side and the second side of the plate-shaped material can be implemented using a single first exposure unit. Depending on the configuration of the apparatus, provision can be made here for the first side to be exposed first, followed by the second side of the plate-shaped material, or, vice versa, the second side can be exposed first by the first exposure unit, followed by the first side of the plate-shaped material.

As a result of the option of moving the first exposure unit from a first position, in which an exposure of the first side of the plate-shaped material is possible, to a second position, in which an exposure of the second side of the plate-shaped material is possible, the exposure apparatus can have a particularly simple and compact embodiment as both sides of the plate-shaped material can be exposed using a single exposure unit.

Preferably, the exposure apparatus comprises at least one further exposure unit. The at least one further exposure unit preferably has a stationary embodiment or it is only configured for a movement in a direction transversely to the conveying direction and parallel to the plane of the plate-shaped material. As a result of the movement transversely to the conveying direction, use can be made of an exposure unit that is not able to expose the entire width of the plate-shaped material in one go.

Depending on the configuration of the exposure apparatus, the first exposure unit can be the only exposure unit or between 1 and 100, preferably between 2 and 10, further exposure units may be provided in addition to the first exposure unit. These further exposure units can be arranged at various positions within the exposure apparatus.

Preferably, the first exposure unit and/or the at least one further exposure unit are configured to expose a strip-shaped area of the plate-shaped material, wherein the long side of the strip-shaped area is oriented perpendicular to a conveying direction of the plate-shaped material. Particularly preferably, the length of the long side of the strip-shaped area corresponds to the width of the plate-shaped material such that the entire width of the plate-shaped material can be exposed in one go.

The first exposure unit and/or the at least one further exposure unit are preferably configured to produce electromagnetic radiation, wherein the wavelength preferably lies in a range from 200 nm to 2000 nm. Particularly preferably, the electromagnetic radiation is narrowband or monochromatic, wherein a wavelength of 350 nm, 365 nm, 370 nm, 375 nm, 385 nm, 395 nm, 400 nm, 405 nm, 532 nm, 830 nm, 1064 nm on its own or a combination of at least two of these wavelengths is preferred.

Preferably, the first exposure unit and/or the at least one further exposure unit comprises a segment or a plurality of segments, wherein a segment comprises at least one light source selected from the group consisting of high-pressure lamps, flashlights, low-pressure lamps, fluorescence lamps, lasers, light emitting diodes (LEDs) and combinations thereof.

If use is made of LEDs, these are preferably arranged in the form of LED strips or LED arrays. Preferably, the first exposure unit comprises LEDs. Possibly present further exposure units may then use other light sources that are not based on LEDs. This renders it possible to expose both sides of the plate-shaped material using LEDs as a light source, without a second exposure unit with LEDs having to be provided. Preferably, the light sources of the further exposure units are light sources that differ from LEDs.

In exposure apparatuses according to the prior art, the expensive UV LEDs are used, in particular, for exposing the front side of a plate-shaped material. Exposing the back side with UV LEDs is likewise desirable on account of the possibility of producing a uniform, flat, structured floor. The floor denotes a region of the printing plate without printing structures. Advantageously, the exposure apparatus according to the invention also allows an exposure of the back side of a plate-shaped material using UV LEDs without having to arrange a further exposure unit equipped with UV LEDs. This reduces costs and leads to a simpler and more compact design of the exposure apparatus.

In one embodiment variant, the segments of an exposure unit all have the same configuration such that these produce electromagnetic radiation with the same intensity and wavelength. Differently designed segments, which differ in terms of the spectrum of the emitted electromagnetic radiation and/or in terms of the intensity of emitted radiation, are provided in an alternative embodiment variant. The spectra of individual segments can differ, for example, in terms of the wavelength of the radiation emitted. Moreover, the segments can each produce broadband radiation, narrowband radiation or monochromatic radiation. Here, in particular, broadband radiation is understood to mean that the segment emits electromagnetic radiation with a bandwidth of 30 nm or more. Narrowband radiation is understood to mean that the bandwidth is less than 30 nm. Monochromatic radiation is understood to mean that the spectrum is dominated by a single wavelength.

Preferably, all segments of the first exposure unit and/or the at least one further exposure unit are used for exposure purposes. Alternatively, preferably, one or more segments of the respective exposure unit are selected for the exposure, depending on the requirements on the spectrum required for the exposure and/or on the intensity required for the exposure.

If at least one further exposure unit is also provided in addition to the first exposure unit, the exposure units are preferably configured in such a way that these are actuatable and operable independently of one another. In particular, it is preferable for the exposure units to be operable on an individual basis in each case, for the exposure units to be operable in alternating fashion and/or for all the exposure units to be operable at the same time. Here, the exposure units are preferably configured in such a way that the employed segments can be selected separately by the actuation for each exposure unit and that the intensity and/or the spectrum are controllable.

By way of the targeted selection of the segments employed for the exposure, it is possible, for example, to undertake an adaptation of the exposure process to different forms of plate-shaped materials. Moreover, the controllability of the intensity and the wavelength allows an adaptation of the exposure to the existing requirements for the processed plate-shaped materials.

The distance between the surface of the plate-shaped material and an exposure unit is usually in the range of 2 mm to 100 mm, preferably 2 mm to 20 mm and, for example, 2 mm to 10 mm. The radiation of UV LEDs has practically no IR component, and so even a high intensity in the case of a small distance from the flexographic printing element is possible, without having to fear a thermal load on the flexographic printing element that is too high. Preferably, the first exposure unit and/or the at least one further exposure unit are configured in such a way that their distances from the plate-shaped materials to be exposed are variably adjustable. To this end, the respective exposure unit is arranged in the exposure apparatus by way of a holder in such a way that a translational movement perpendicular to the plane of the plate-shaped material is facilitated. Preferably, the holder facilitates a translation movement in the range of 1 mm to 100 mm.

If at least one further exposure unit is provided, a further exposure unit is preferably arranged pointing in the direction of the drum or the continuous conveyor belt in such a way that the at least one further exposure unit, is configured to expose plate-shaped materials that are arranged on the drum or of the continuous transport belt. Preferably, more than one further exposure unit is arranged pointing on the drum or of the continuous conveyor belt, for example 2 to 10 further exposure units. Said further exposure units are preferably arranged distributed around the drum, and each aligned on the rotation axis of the drum, in such a way that a plate-shaped material arranged on the drum can be completely exposed on account of the multiplicity of further exposure units in the case of a drum that is at rest.

Preferably, the at least one further exposure unit is embodied as a ring-shaped arrangement, which is displaceable along the rotation axis of the drum, wherein the ring-shaped arrangement comprises light sources that are directed at the surface of the drum. In particular, these light sources can be configured as LEDs. As a result of such a ring-shaped exposure unit, a ring-shaped region of the surface of the drum is exposed and a section of the plate-shaped material arranged on the drum is exposed accordingly. The ring-shaped exposure unit is displaced along the rotation axis of the drum for the purposes of exposing the entire surface of the plate-shaped material, wherein the drum is at rest or it rotates in the process. The drum preferably rotates when the ring-shaped exposure unit is displaced along the rotation axis of the drum.

Preferably, a further exposure unit is arranged in such a way that the latter is opposite the first exposure unit for one of the positions of the first exposure unit. Here, the provision is preferably made for the plate-shaped material to be transported between the first exposure unit and this further exposure unit through the conveyor apparatus. As a result of this, a simultaneous exposure of both the first side and the second side of the plate-shaped material is facilitated.

Preferably, the exposure apparatus additionally comprises an imaging unit, By way of example, the latter can be configured as a laser system or as an inkjet printer system.

In the case of a configuration as a laser system, the layers of the plate-shaped material that are configured as an ablatable mask layer, which is opaque to UV radiation, can be selectively removed and a mask can thus be created. In the case of a configuration as an inkjet printer system, a material that is nontransparent to UV radiation can be selectively applied to the plate-shaped material and a mask can be created in this manner.

The imaging unit is preferably placed opposite the drum and directed at the drum in such a way that a mask can be written on the plate-shaped material that is received by the drum.

The exposure apparatus preferably comprises a control unit for controlling the first exposure unit, the optionally present further exposure units and the conveyor unit. Preferably, the control unit is further configured to control a possibly present imaging unit. Preferably, the control unit is connected to further apparatuses which are used in conjunction with the exposure apparatus for the purposes of producing a printing plate. Here, in particular, the conveying of the plate-shaped materials between the individual apparatuses is coordinated. The further apparatuses can be, in particular, imaging apparatuses, washers, developers, a UV post-processing apparatus and a dryer. Likewise, the control unit is preferably connected to a storage management such that the plate-shaped materials can be taken from a storage device, processed and returned to a storage device again, depending on requirements.

In particular, the control unit controls the individual exposure processes of the first side and/or the second side of the plate-shaped material that are carried out individually by the exposure apparatus, wherein different parameters may be chosen for each side to be exposed and/or for each employed exposure unit. Here, provision can also be made for the exposure of one of the sides of the plate-shaped material to be dispensed with. The control unit may also control and monitor all other processes that are linked to the processing of the plate-shaped material, wherein individual parameters and processes may also be excluded. In general, the parameters relate to exposure time, exposure intensity, wavelength, exposure frequency and prevalence, conveying speed, rotation speed of the drum, position of the first exposure unit, distance of the exposure unit from the plate surface, temperature, type of the inert gas and/or the concentration thereof, format of the plate-shaped material (thickness, length, width, material). Furthermore, the control unit is preferably connected to sensors that monitor the state of the apparatus and/or of the plate-shaped material, such as, for example, ultrasonic sensors, temperature sensors, intensity sensors, movement sensors, gas sensors, position sensors, frequency sensors, speed sensors and any combination. Preferably, the control unit also communicates with other appliances.

The exposure apparatus is preferably configured to carry out at least one exposure process under the protection of an inert gas. To this end, at least one portion of the exposure apparatus is configured to expose the plate-shaped material to an inert gas while the plate-shaped material is exposed by the first exposure unit and/or by at least one further exposure unit. The portion can be sealed from the surroundings and/or an inert gas supply is arranged in the portion. In particular, the inert gas can be nitrogen, carbon dioxide or a noble gas such as argon, for example.

The exposure apparatus is preferably configured to subject the plate-shaped material and/or the first exposure unit and, optionally, the at least one further exposure unit to temperature control. To this end, the exposure apparatus comprises at least one temperature-control device, which is embodied, for example, as an infrared emitter, as a temperature-controlled roller, as hot air supply or as a cooling device. Preferably, the plate-shaped material is controlled to a predetermined temperature before an exposure process is carried out. To this end, it is preferable for at least one temperature-control device to be arranged upstream of the corresponding exposure unit in the conveying direction of the plate-shaped material.

Preferably, the exposure apparatus furthermore comprises a transfer unit, which is configured to transform the plate-shaped material to a further apparatus. By way of example, the transfer unit can be configured as a gripper or as a displaceable table.

A further aspect of the invention relates to the provision of an apparatus for producing printing plates from a plate-shaped material, said apparatus comprising one of the described exposure apparatuses for exposing a first side and a second side of the plate-shaped material, a washer and a dryer and/or a developer.

In addition to the exposure apparatus, such an apparatus comprises further apparatuses that are required for producing printing plates from a plate-shaped material. Here, the washer and/or developer and the dryer are disposed downstream of the exposure apparatus.

The washer serves to wash out non-exposed regions of a relief-forming layer of the plate-shaped material by means of a solvent and/or water or aqueous solutions. To this end, use is made of washout appliances such as a brush washer, for example. A thermal development can be implemented as an alternative to washing. Developers in which a developer medium is brought into contact with the liquefied unexposed material and removed can be used for thermal development purposes.

If use is made of solvents and/or water or aqueous solutions for the purposes of washing out non-exposed parts of a relief-forming layer of the plate-shaped material, this is followed by drying in a downstream dryer.

Particularly if the exposure apparatus used in the apparatus has no imaging unit, the apparatus preferably comprises an imaging apparatus that is connected upstream of the exposure apparatus. In a preferred embodiment, the imaging apparatus is configured to image laser-ablatable mask layers.

Usually, the surface of the obtained printing plate is subjected to post-processing after drying, for example by exposing the surface to UVA and/or UVC radiation. To this end, the apparatus preferably comprises a post-exposure apparatus connected downstream of the dryer. However, it is also possible to carry out the post-exposure in the above-described exposure apparatus.

A further aspect of the invention lies in the provision of a method for exposing plate-shaped materials. The above-described exposure apparatus is embodied and/or configured to carry out the methods described herein. Accordingly, features described within the scope of the method are disclosed accordingly for the exposure apparatus and, vice versa, the features described within the scope of the exposure apparatus are disclosed accordingly for the methods.

The proposed method for exposing plate-shaped materials comprises the steps of:

a) providing a plate-shaped material,
b) inserting the plate-shaped material into one of the above-described exposure apparatuses,
c) conveying the plate-shaped material such that a first side of the plate-shaped material is supplied to a first exposure unit and the first side is exposed by the first exposure unit, wherein the first exposure unit is rotatable about an axis and situated in a first position, d) conveying the plate-shaped material such that a second side of the plate-shaped material is supplied to the first exposure unit and the second side is exposed by the first exposure unit, wherein the first exposure unit, which is rotatable about an axis, is situated in a second position, e) removing the plate-shaped material from the exposure apparatus.

In particular, steps b) of inserting the plate-shaped material and the removal of the plate-shaped material according to step e) can each be carried out, at least in part, at the same time as or in parallel with one of the steps c) or d), in which the plate-shaped material is conveyed and exposed. Consequently, conveying and exposing can already be started before the plate-shaped material has been completely inserted into the apparatus according to step b) and, accordingly, a step of conveying and exposing can still be carried out while parts of the plate-shaped material have already been removed from the exposure apparatus according to step e).

According to step a) of the method, the plate-shaped material can be provided from a storage or it can be supplied individually in each case. Alternatively, the plate-shaped material is taken from a further treatment apparatus arranged upstream of the exposure apparatus, for example from an imaging apparatus for producing a mask.

Steps c) and d) of the method can be carried out in any sequence, wherein the first exposure unit is moved from one position into the corresponding other position between the steps. In the case of a change from step c) to step d), the first exposure unit is moved from the first position into the second position and, vice versa, the first exposure unit is moved from the second position into the first position in the case of a change from step d) to step c).

The conveying speed of the plate-shaped material is preferably chosen in the range of 1 mm/min to 10 000 mm/min. Here, different conveying speeds can be selected in each case for different portions of the exposure unit and, accordingly, for the implementation of the various steps of the method.

Preferably, the plate-shaped material is conveyed in step d) using a drum and/or a continuous conveyor belt, wherein the first exposure unit faces the drum or the continuous conveyor belt in the second position.

Preferably, the drum comprises at least one fastening apparatus. In this case, in step d) of the method, the plate-shaped material is initially fastened to the drum and supplied to the second position of the first exposure unit by rotating the drum. The plate-shaped material is released from the drum again after the exposure has been carried out.

Preferably, the rotational speed of the drum is selected in such a way that it lies in the range of 0.1 to 5000 revolutions per minute.

Preferably, the plate-shaped material is guided past the first exposure unit at least once as a result of rotating the drum and said plate-shaped material is exposed by said exposure unit. In further variants of the method, provision can be made for the plate-shaped material to be guided past the first exposure unit multiple times by rotating the drum multiple times and, accordingly, provision can be made for said plate-shaped material to be exposed multiple times. By way of example, in the region of 2 to 1000 exposures can be undertaken by the corresponding number of rotations of the drum.

Depending on the diameter of the drum, provision can be made for only one plate-shaped material to be respectively received on the drum at the same time. In the case of an appropriate diameter of the drum and a corresponding format of the plate-shaped material, more than one plate-shaped material may also be arranged on the drum at the same time.

Provision can be made for a mask to be produced on the plate-shaped material during the time in which the plate-shaped material is received on the drum. An imaging unit can be used to this end, the latter being embodied as an ablation laser, for example, and selectively removing an ablatable mask layer.

Preferably, the second side is exposed using at least one further exposure unit while the plate-shaped material is conveyed according to steps c) and/or d).

Preferably, the second side is exposed using at least one further exposure unit while the plate-shaped material is exposed by the first exposure unit.

Preferably, the second side of the plate-shaped material is exposed when being conveyed according to step c) and/or d) using at least one further exposure unit. If conveying according to step d) is implemented using a drum, the at least one further exposure unit is particularly preferably arranged in such a way that the latter points on the drum. The drum can rotate or be at rest during the exposure of the second side by the at least one further exposure unit. In the case of the exposure with the drum at rest, a plurality of further exposure units are preferably arranged around the drum with such a distribution that the entire area of the plate-shaped material is impinged uniformly by radiation by way of the further exposure units. Then, the plate-shaped material is positioned by the drum in such a way that exposure is possible when the drum is at rest. Subsequently, the exposure is carried out when the drum is at rest. The plate-shaped material is conveyed onward by the drum after the exposure.

A further exposure can be implemented using at least one further exposure unit in addition to the exposures carried out according to steps c) or d). If step c) is carried out before step d), the further exposure follows step d). If step c) is implemented after step d), the further exposure is implemented before step d) is carried out. Here, there can be an exposure of the first side and/or the second side of the plate-shaped material by way of an appropriate arrangement of the at least one further exposure unit.

The intensity used in the respective exposures of steps c) and/or d) and, optionally, in the further exposure, preferably lies in the range of 0.1 mW/cm$^2$ to 10 mW/cm$^2$. Here, the dose of the irradiation, which is given by the intensity and an exposure time, is selected in such a way that the irradiation with the electromagnetic radiation is sufficient to cure a relief-forming material that is arranged on the plate-shaped material. By way of example, curing is implemented by linking or polymerizing reactive monomers that are contained in the relief-forming material.

The exposure conditions, in particular the wavelength, the intensity, the conveying speed and/or of the continuous conveyor belt and/or the rotational speed of the drum may be selected in such a way that, after washing out and/or developing and drying, round top dots or round and flat or flat top dots arise.

The plate-shaped material is preferably a printing plate comprising a dimensionally stable carrier layer and at least one relief-forming layer. The relief-forming material on is preferably photoactive, i.e., curable or linkable by the action of electromagnetic radiation. Additionally, provision can be made of further layers, for example at least one protective layer, at least one barrier layer and/or at least one mask layer. Combinations of a plurality of the aforementioned layers are also possible.

The exposures carried out in steps c) and/or d) and, optionally, in the further exposure are preferably implemented in an inert atmosphere.

BRIEF DESCRIPTION OF THE FIGURES

FIG. 4 schematically shows a fourth embodiment of the exposure apparatus, and

FIG. 5 schematically shows a fifth embodiment of the exposure apparatus, which comprises at least one further exposure unit.

The invention and the method according to the invention are described in the exemplary embodiments below. In the description of the exemplary embodiments of the invention, the same or similar components and elements are denoted by the same reference sign, with the repeated description of these components or elements being dispensed with in individual cases. The figures only illustrate the subject matter of the invention schematically.

Figure 1:
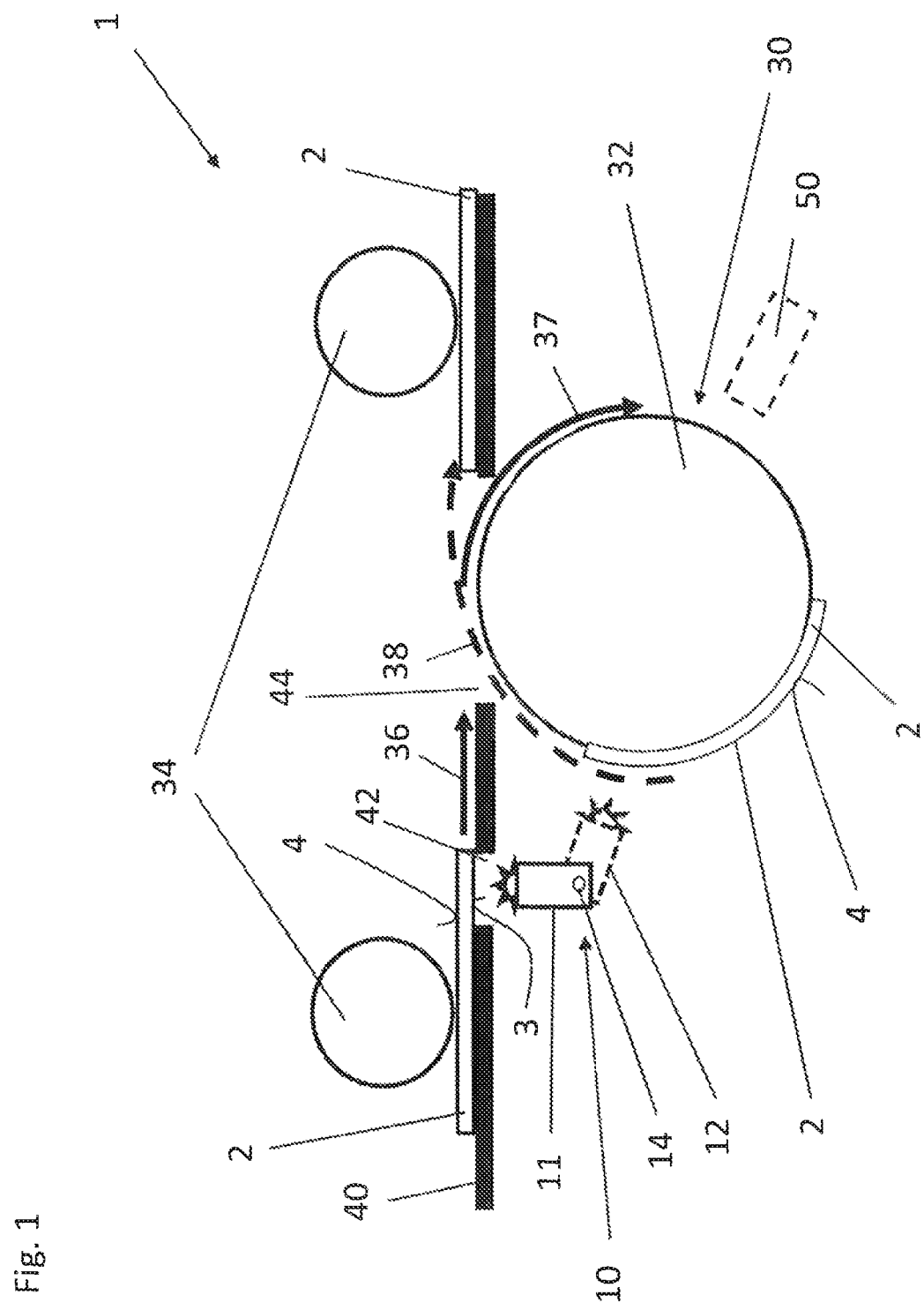
FIG. 1 schematically shows a first embodiment of the exposure apparatus.

FIG. 1 shows a first embodiment of an exposure apparatus 1 in a schematic illustration. The exposure apparatus 1 comprises a first exposure unit 10 and a conveyor unit 30. The conveyor unit 30 comprises a drum 32, which conveys plate-shaped material 2, for example a printing element. In an alternative embodiment, a continuous conveyor belt may be provided in place of the drum 32. Optionally, the conveyor unit 30 may still comprise further elements. In the exemplary embodiment illustrated in FIG. 1, a shelf 40 and transport rollers 34 are provided in addition to the drum 32. In further embodiment variants, the shelf 40 can also be configured as a conveyor belt. In the embodiment illustrated in FIG. 1, the shelf 40 is composed of a plurality of partial units and interrupted into regions 42 and 44.

The plate-shaped material 2 comprises a first side 3, which represents the lower side of the plate-shaped material 2 in the embodiment 1, and a second side 4, which represents the upper side of the plate-shaped material 2 in the illustrated exemplary embodiment.

The first exposure unit 10 is configured as a UV light source, for example as an LED strip with a multiplicity of UV LEDs. Moreover, the first exposure unit 10 has a rotatable embodiment such that the latter is rotatable about an axis of rotation 14. By rotating the first exposure unit 10 about the axis of rotation 14, the first exposure unit 10 can adopt a plurality of positions, wherein the first exposure unit 10 may adopt at least a first position 11 and a second position 12. In the embodiment illustrated in FIG. 1, the first exposure unit 10 is arranged below the shelf 40 or the conveyor belt, with the shelf 40 or the conveyor belt being interrupted in a region 42, which lies directly above the first exposure unit 10. The first side 3 of the plate-shaped material 2, which otherwise lies on the shelf 40 or the conveyor belt, is accessible from below as a result of the interrupted region 42 of the shelf 40 or the conveyor belt.

The exposure apparatus 1 shown in FIG. 1 is configured to expose both the first side 3 and the second side 4 of the plate-shaped material 2 using the first exposure unit 10. To this end, the plate-shaped material 2 is moved along the direction marked by reference sign 36 in a first step using the shelf 40, which is configured as a conveyor belt, and/or using one of the transport rollers 34. In so doing, the plate-shaped material 2 is moved past the first exposure unit 10 while the first exposure unit 10 is in its first position 11. The first exposure unit 10 is preferably configured in such a way that the latter can expose a rectangular area where one side of the rectangle is wider than the width of the plate-shaped material 2 such that the plate-shaped material 2 is exposed over the entire width thereof in one go by the first exposure unit 10. Here, UV light from the first exposure unit 10 in the first position 11 reaches the plate-shaped material 2 through the interrupted region 42.

If the plate-shaped material 2 is a flexographic printing element, the first side 3 is preferably the back side of the flexographic printing element such that, in the first step, a back-side exposure is undertaken by the exposure unit 10 in the first position 11.

When exposing the first side 3 of the plate-shaped material 2, the apparatus 1 illustrated in FIG. 1 can convey said plate-shaped material continuously along the direction marked by the arrow 36. As an alternative thereto, conveying can be implemented in discontinuous fashion, wherein a portion of the plate-shaped material 2 is conveyed into the field of view of the first exposure unit 10 and the conveying is thereupon stopped in each case, the exposure of this portion is implemented and, subsequently, the plate-shaped material 2 is conveyed onward in order to expose the next portion.

In a second step, the plate-shaped material 2 is conveyed to the drum 32 and received on the drum 32, wherein, as indicated by arrow 37, the plate-shaped material 2 revolves together with the drum 32. Here, the drum 32 is arranged below the shelf 40 or the conveyor belt in such a way that the plate-shaped material 2 is placed on the drum 32 from above through a further interruption 44 of the shelf 40 or the conveyor belt and subsequently received on the drum 32. Preferably, the drum 32 comprises at least one fastening apparatus, which is equipped, for example, as a vacuum suction fastening mechanism, with the aid of punch holes, or punches or clamps, for the purposes of receiving the plate-shaped material 2. To this end, apertures are provided on the surface of the drum 32, by means of which apertures the plate-shaped material 2 can be affixed by way of negative pressure.

The first exposure unit 10 is moved from the first position 11 into its second position 12 by way of a rotation about the axis of rotation 14 and it now points at the drum 32. The plate-shaped material 2 is guided past the first exposure unit 10 again as a result of rotating the drum 32, wherein the second side 4 of the plate-shaped material 2 now faces the first exposure unit 10 and said second side is exposed by the first exposure unit 10. Depending on the requirements of the implemented exposure process, it is once again possible for the plate-shaped material 2 to be guided past the first exposure unit 10 in the second position 12 in continuous or discontinuous fashion. If a plurality of exposures are required, further exposures can be implemented by further rotations of the drum 32. After the exposure of the second side 4 of the plate-shaped material 2, the first exposure unit 10 is moved back into its first position 11 again such that it is available for an exposure of the first side 3 of a further plate-shaped material.

If the plate-shaped material 2 is a flexographic printing element, the second side 4 is preferably the front side of the flexographic printing element.

In one embodiment variant of exposure apparatus 1, provision can be made for an imaging unit 50 to be additionally provided for the purposes of writing a mask on the plate-shaped material 2. The imaging unit 50 points in the direction of the drum 32 such that the mask can be written while the plate-shaped material 2 is guided past the imaging unit 50 in continuous or discontinuous fashion by way of a rotation of the drum 32. As seen in the conveying direction, the imaging unit 50 is arranged upstream of the first exposure unit 10 in the second position 12; see arrow 37. In this way, the mask used for an image-type exposure of the second side 4 is produced briefly before the exposure by the first exposure unit 10 in the second position 12. By way of example, the imaging unit 50 can be a laser system, by means of which a laser-ablatable mask layer of the plate-shaped material 2 is selectively removed.

In a third step, the plate-shaped material 2 is detached from the drum 32 along the direction indicated by the arrow 38. In so doing, a fastening apparatus possibly present on the drum 32 releases the plate-shaped material 2. The plate-shaped material 2 is returned to the shelf 40 or the conveyor belt and conveyed out of the exposure apparatus 1. Subsequently, the plate-shaped material 2 can be postprocessed in further apparatuses. If the exposure apparatus 1 is part of an overall apparatus for producing printing plates, there can be a transfer to the next processing apparatus; in particular, the plate-shaped material 2 can be transferred to a developer or a washer.

Figure 2:
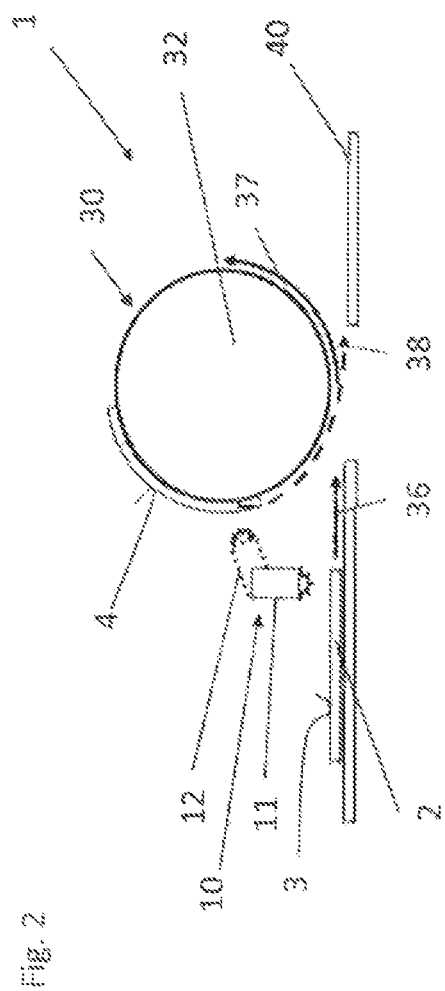
FIG. 2 schematically shows a second embodiment of the exposure apparatus.

FIG. 2 shows a second embodiment of the exposure apparatus 1, which, like the first embodiment described with reference to FIG. 1, a first exposure unit 10 and a conveyor unit 30. The conveyor unit 30 comprises a drum 32. Additionally, the conveyor unit 30 comprises a shelf 40 embodied as a conveyor belt in the embodiment illustrated in FIG. 2. In contrast to the first embodiment, both the first exposure unit 10 and the drum 32 are arranged above the shelf 40 or the conveyor belt. Moreover, no interruption of the shelf 40 is provided in the region of the first exposure unit 10.

For the purposes of exposing the plate-shaped material 2 on both sides, provision is made in a first step for the plate-shaped material 2 to be guided past the first exposure unit 10, which is situated in the first position 11, along the direction specified by the arrow 36. Here, the first side 3 of the plate-shaped material 2 is exposed. Once again, the exposure can be implemented in continuous or discontinuous fashion. Since the first exposure unit 10 is situated above the shelf 40 or the conveyor belt, no interruption of the shelf 40 or of the conveyor belt is required in the region of the first exposure unit 10 since there is no exposure of the side of the plate-shaped material 2 that lies on the conveyor belt 40. After the exposure, the plate-shaped material 2 is moved further toward the drum 32 along the direction indicated by the arrow 36.

The drum 32 is likewise arranged above the plane of the shelf 40 or the conveyor belt, and so the plate-shaped material 2 meets the surface of the drum 32 on the lower side of the drum 32 and said plate-shaped material is arranged on the surface of the drum 32. The plate-shaped material 2 received on the drum 32 subsequently rotates together with the rotating drum 32. The rotational movement is indicated by the arrow 37. The first exposure unit 10 is moved into the second position 12, in which the latter is now aligned on the drum 32. While the drum 32 rotates, the plate-shaped material 2, with its second side 4, is moved past the first exposure unit 10 in the second position 12 and exposed. Once again, this exposure process can be implemented in continuous or discontinuous fashion. If a plurality of exposures are required, further exposures can be implemented with further revolutions of the drum 32.

Optionally, as described in relation to FIG. 1, provision can be made of an additional imaging unit which writes a mask into the plate-shaped material 2 before the latter moves past the first exposure unit 10 in the second position 12 while the plate-shaped material 2 is received on the drum 32.

The plate-shaped material 2 is detached from the drum 32 along the direction indicated by the arrow 38 in a third step, wherein a fastening apparatus that is optionally present on the drum 32 releases the plate-shaped material 2. The plate-shaped material 2 is placed on the shelf 40 or the conveyor belt again and conveyed out of the exposure apparatus 1. Subsequently, the plate-shaped material can be postprocessed in further apparatuses. If the exposure apparatus 1 is part of an overall apparatus for producing printing plates, there can be a transfer to the next processing apparatus; in particular, the plate-shaped material 2 can be transferred to a developer or a washer. For transfer purposes, the exposure apparatus may additionally comprise a transfer unit with appropriate conveying means.

Figure 3:
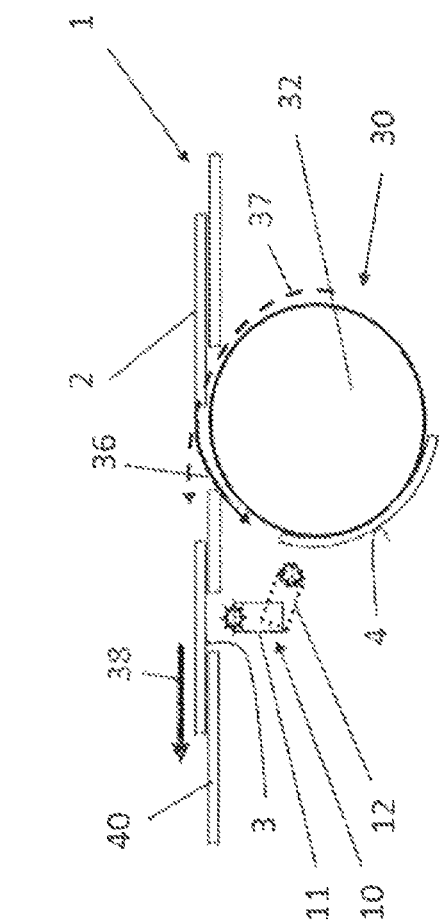
FIG. 3 schematically shows a third embodiment of the exposure apparatus.

FIG. 3 shows a third embodiment of the exposure apparatus 1. In terms of its design, it corresponds to the first embodiment described with reference to FIG. 1; however, the plate-shaped material 2 passes through the exposure apparatus 1 in the opposite direction.

In a first step, the first exposure unit 10 is in its second position 12 and the plate-shaped material 2 is placed on the drum 32 from above along the direction indicated by the arrow 36 via the shelf 40 or the conveyor belt and said plate-shaped material is subsequently received on the drum 32 such that the plate-shaped material 2 rotates with the drum 32. While the plate-shaped material 2 is guided past the first exposure unit 10 in the second position 12, the second side 4 is exposed by the first exposure unit 10. Once again, the exposure can be implemented in continuous or discontinuous fashion. If a plurality of exposures are required, further exposures can be implemented with further revolutions of the drum 32.

In a second step, the plate-shaped material 2 is released from the drum 32 and, as indicated by the arrow with reference sign 37, placed on the shelf 40 or the conveyor belt. The first exposure unit 10 is moved into its first position 11.

In a third step, the first side 3 of the plate-shaped material 3 is exposed from below through an interrupted region 42 by the first exposure unit 10 in the first position 11. The plate-shaped material 2 is moved continuously or discontinuously in the process along the direction marked by the arrow 38, depending on the embodiment of the exposure process, and subsequently conveyed out of the exposure apparatus 1. After the exposure, the first exposure unit 10 is moved back into the second position 12 such that the latter is available for further exposure of the second side of a further plate-shaped material.

Following the exposure of the first side 3, the plate-shaped material 2 can be postprocessed in further apparatuses. If the exposure apparatus 1 is part of an overall apparatus for producing printing plates, there can be a transfer to the next processing apparatus; in particular, the plate-shaped material 2 can be transferred to a developer or a washer.

FIG. 4 shows a fourth embodiment of the exposure apparatus 1. In terms of its design, it corresponds to the second embodiment described with reference to FIG. 2; however, the plate-shaped material 2 passes through the exposure apparatus 1 in the opposite direction.

In a first step, the first exposure unit 10 is in its second position 12 and the plate-shaped material 2 is guided to the drum 32 from below along the direction indicated by the arrow 36 via the shelf 40 or the conveyor belt and said plate-shaped material 2 is subsequently received on the drum 32 such that the plate-shaped material 2 rotates with the drum 32. The second side 4 is exposed by the first exposure unit 10 while the plate-shaped material 2 is guided past the first exposure unit 10 in the second position 12. Once again, the exposure can be implemented in continuous or discontinuous fashion. Should a plurality of exposures be required, further exposures can be implemented with further revolutions of the drum 32.

In a second step, the plate-shaped material 2 is detached from the drum 32 and placed on the shelf 40 or the conveyor belt as indicated by the arrow with reference sign 37. The first exposure unit 10 is moved into its first position 11.

In a third step, the first side 3 of the plate-shaped material 3 is exposed from above by the first exposure unit 10 in the first position 11. Here, the plate-shaped material 2 is moved continuously or discontinuously along the direction marked by the arrow 38, depending on the embodiment of the exposure process, and subsequently conveyed out of the exposure apparatus 1. After the exposure, the first exposure unit 10 is moved back into the second position 12 such that the exposure unit is available for a further exposure of the second side of a further plate-shaped material.

Following the exposure of the first side 3, the plate-shaped material 2 can be postprocessed in further apparatuses. If the exposure apparatus 1 is part of an overall apparatus for producing printing plates, there can be a transfer to the next processing apparatus; in particular, the plate-shaped material 2 can be transferred to a developer or a washer.

FIG. 5 shows a fifth embodiment of the exposure apparatus 1. In terms of its design, it corresponds to the first embodiment described with reference to FIG. 1; however, further exposure units 20, 22, 24 are additionally provided. The further exposure units 20, 22, 24 are optional, and so, depending on the embodiment variant, only one further exposure unit 20, 22, 24 or only a few of the illustrated further exposure units 20, 22, 24 are arranged.

A further exposure unit 22 is arranged opposite the first exposure unit 10 in the first position 11, and so said further exposure unit can expose the second side 4 of the plate-shaped material 2 while the first exposure unit 10 in the first position 11 exposes the first side 3.

Moreover, further exposure units 20 are arranged distributed around the drum 32, wherein the further exposure units 20 each point to the drum 32. In this way, the further exposure units 20 facilitate an exposure of the second side 4 of the plate-shaped material while the latter is received by the drum 32. Here, a plurality of further exposure units 20 are preferably arranged distributed around the drum 32 in such a way that the entire area of the second side 4 of the plate-shaped material 2 can be exposed at once, even if the drum 32 is at rest.

As seen in the conveying direction 38, a further exposure unit 24 is arranged above the shelf 40 or the conveyor belt after the drum 32. A further exposure of the second side 4 of the plate-shaped material 2 can be implemented by way of the further exposure unit 24, said further exposure following an exposure of the second side 4 by the first exposure unit 10 in the second position 12.

Naturally, the further exposure units 20, 22, 24 can be combined with the embodiments of the exposure apparatus described with reference to FIGS. 2 to 4.

The invention claimed is:

1. An exposure apparatus for exposing a plate-shaped material, wherein the plate-shaped material has a first side and a second side that lies opposite the first side and wherein the exposure apparatus comprises a first exposure unit and a conveyor unit, wherein the first exposure unit comprises at least one segment with a light source and has an embodiment so as to be rotatable about an axis, wherein the first exposure unit can adopt a first position and a second position by way of a rotation about the axis and the first exposure unit and the conveyor unit are configured in such a way that the first side of the plate-shaped material is supplied for an exposure in the first position of the first exposure unit and moved past the first exposure unit and the second side of the plate-shaped material is supplied for an exposure in the second position of the first exposure unit and moved past the first exposure unit.

2. The exposure apparatus as claimed in claim 1, wherein the exposure apparatus further comprises at least one further exposure unit.

3. The exposure apparatus as claimed in claim 1, wherein the first exposure unit is configured to expose a strip-shaped area of the plate-shaped material, wherein the long side of the strip-shaped area is oriented perpendicular to a conveying direction of the plate-shaped material.

4. The exposure apparatus as claimed in claim 2, wherein the first exposure unit and/or the at least one further exposure unit produce electromagnetic radiation, wherein the wavelength lies in a range from 200 nm to 2000 nm.

5. The exposure apparatus as claimed in claim 2, wherein the first exposure unit and/or the at least one further exposure unit produce electromagnetic radiation, wherein the electromagnetic radiation is narrowband or monochromatic with a wavelength of 350 nm, 360 nm, 365 nm, 370 nm, 375 nm, 385 nm, 395 nm, 400 nm, 405 nm, 532 nm, 830 nm, 1064 nm or a combinations of at least two of these wavelengths.

6. The exposure apparatus as claimed in claim 2, wherein the first exposure unit and/or the at least one further exposure unit comprises a segment or a plurality of segments, wherein a segment comprises at least one light source selected from the group consisting of high-pressure lamps, flashlights, low-pressure lamps, fluorescence lamps, lasers, light emitting diodes (LEDs) and combinations thereof.

7. The exposure apparatus as claimed in claim 1, wherein the conveyor unit comprises a rotatable drum, wherein the axis of rotation of the first exposure unit extends parallel to the rotation axis of the drum or in that the conveyor unit comprises a continuous conveyor belt, wherein the axis of rotation of the first exposure unit is aligned perpendicular to a conveying direction of the continuous conveyor belt and parallel to a plane of the continuous conveyor belt.

8. The exposure apparatus as claimed in claim 7, wherein the conveyor unit has at least one fastening apparatus for the plate-shaped material, selected from a fastening strip, a clamping apparatus, a vacuum suction fastening mechanism or a combination of a plurality of fastening apparatuses.

9. The exposure apparatus as claimed in claim 7, which further comprises at least one further exposure unit and wherein the at least one further exposure unit is arranged pointing in the direction of the conveyor unit in such a way that the at least one further exposure unit is configured to expose plate-shaped materials arranged on the conveyor unit.

10. The exposure apparatus as claimed in claim 7, which further comprises at least one further exposure unit wherein the at least one further exposure unit is embodied as a ring-shaped arrangement, which is displaceable along the rotation axis of the drum, wherein the ring-shaped arrangement comprises light sources that are directed at the surface of the drum.

11. The exposure apparatus as claimed in claim 2, wherein the at least one further exposure unit is arranged in such a way that the latter is opposite the first exposure unit for one of the positions of the first exposure unit.

12. The exposure apparatus as claimed in claim 1, wherein the exposure apparatus additionally comprises an imaging unit.

13. An apparatus for producing printing plates from a plate-shaped material, comprising
- an exposure apparatus as claimed in claim 1 for exposing a first side and a second side of the plate-shaped material,
- a washer unit and a dryer unit or a developer unit.

14. A method for exposing plate-shaped materials, comprising the steps of:
- a) providing a plate-shaped material,
- b) inserting the plate-shaped material into an exposure apparatus as claimed in claim 1,
- c) conveying the plate-shaped material such that a first side of the plate-shaped material is supplied to a first exposure unit and the first side is moved past the first exposure unit and exposed by the first exposure unit, wherein the first exposure unit is rotatable about an axis and situated in a first position,
- d) conveying the plate-shaped material such that a second side of the plate-shaped material is supplied to the first exposure unit and the second side is moved past the first exposure unit and exposed by the first exposure unit, wherein the first exposure unit, which is rotatable about an axis, is situated in a second position,
- e) removing the plate-shaped material from the exposure apparatus,
wherein steps c) and d) can be carried out in any sequence and steps b) and e) can each be carried out at least partly in parallel with any one of steps c) and d).

15. The method as claimed in claim 14, wherein, in step d), the plate-shaped material is moved using a conveyor unit and the first exposure unit faces the conveyor unit in the second position.

16. The method as claimed in claim 14, wherein, while the plate-shaped material is conveyed according to steps c) and/or d), an exposure of the second side is implemented using at least one further exposure unit.

17. The method as claimed in claim 14, wherein, while the plate-shaped material is exposed by the first exposure unit, an exposure of the second side is implemented using at least one further exposure unit.

18. The exposure apparatus as claimed in claim 2, wherein the at least one further exposure unit is configured to expose a strip-shaped area of the plate-shaped material, wherein the long side of the strip-shaped area is oriented perpendicular to a conveying direction of the plate-shaped material.

* * * * *